United States Patent
Lee et al.

(10) Patent No.: US 7,408,244 B2
(45) Date of Patent: Aug. 5, 2008

(54) SEMICONDUCTOR PACKAGE AND STACK ARRANGEMENT THEREOF

(75) Inventors: Yonggill Lee, Kaohsiung (TW); Sangbae Park, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/416,206

(22) Filed: May 3, 2006

(65) Prior Publication Data

US 2006/0261453 A1 Nov. 23, 2006

Related U.S. Application Data

(62) Division of application No. 11/080,483, filed on Mar. 16, 2005, now abandoned.

(51) Int. Cl.
*H01L 23/495* (2006.01)

(52) U.S. Cl. ............ 257/666; 257/668; 257/676; 257/685; 257/686; 257/701; 257/702; 257/704; 257/734; 257/735; 257/E23.031; 257/E23.038; 257/E23.039; 257/E23.061; 257/E23.085

(58) Field of Classification Search .......... None
See application file for complete search history.

(56) References Cited

U.S. PATENT DOCUMENTS

| | | | |
|---|---|---|---|
| 5,814,883 A * | 9/1998 | Sawai et al. | 257/712 |
| 5,939,779 A | 8/1999 | Kim | 257/692 |
| 6,002,170 A * | 12/1999 | Kim et al. | 257/698 |
| 6,605,866 B1 | 8/2003 | Crowley et al. | 257/692 |
| 6,649,834 B1 * | 11/2003 | Hsieh et al. | 174/527 |
| 6,876,068 B1 | 4/2005 | Lee et al. | 257/676 |
| 7,045,396 B2 * | 5/2006 | Crowley et al. | 438/123 |
| 2005/0098879 A1 * | 5/2005 | Kim | 257/712 |

* cited by examiner

*Primary Examiner*—Minh-Loan Tran
*Assistant Examiner*—Leslie Pilar Cruz
(74) *Attorney, Agent, or Firm*—Muncy, Geissler, Olds & Lowe, PLLC

(57) ABSTRACT

A semiconductor package includes a semiconductor chip electrically connected to a plurality of leads arranged at the periphery of the semiconductor chip wherein each of the leads is bent to have a first portion exposed from the upper surface of the semiconductor package and a second portion exposed from the lower surface of the semiconductor package. Both of the first portion and the second portion of each lead can be utilized for making external electrical connection.

9 Claims, 6 Drawing Sheets

SEMICONDUCTOR PACKAGE AND STACK ARRANGEMENT THEREOF

This application is a division of U.S. patent application Ser. No. 11/080,483, filed Mar. 16, 2005 now abandoned.

BACKGROUND OF THE INVENTION

1. Field of the Invention

This invention relates to lead frame packages, and more specifically to leadless semiconductor packages.

2. Description of the Related Art

Lead frame packages have been used for a long period of time in the IC packaging history mainly because of their low manufacturing cost and high reliability. Although the traditional lead frame packages have become gradually obsolete for some high performance-required packages, they still remains their market share as a cost-effective solution for low I/O ICs. Traditional lead frame package has its limit of providing a solution for chip scale and low profile package due to the long inner leads and outer leads. Therefore, the semiconductor packaging industry develops a leadless package without outer leads such that both the footprint and the package profile can be greatly reduced.

FIGS. 10 and 11 show a leadless package 10 wherein the leads 11a are disposed at the bottom of the package as compared to the conventional gull-wing or J-leaded type package. The die pad 11b of the leadless package 10 is exposed from the bottom of the package thereby providing better heat dissipation. Typically, there are four tie bars 11c being connected to the die pad 11b. The leadless package 10 includes a chip 12 sealed in a package body 13. The active surface of the chip 12 is provided with a plurality of bonding pads (not shown) electrically connected to the leads 11a via wire bonding.

Due to the elimination of the outer leads, leadless packages are featured by lower profile and weight. Furthermore, the leadless package 10 is also a cost-effective package due to its use of existing BOM (bill of materials). All the above-mentioned properties make the current leadless packages very suitable for telecommunication products such as cellular phones, portable products such as PDA (personal digital assistant), digital cameras, and IA (Information Appliance).

However, this conventional leadless package has various design and production limitations. For example, since only the bottom of the package is provided with the leads 11a for making external electrical connection, the package 10 can be mounted onto an external substrate (such as a printed circuit board (PC board)) only in a die up orientation. This limitation is especially apparent when the chip to be packaged is an image sensor chip which needs an opening sealed by a transparent lid formed in the package thereby allowing the image sensor chip to be exposed to the object to be sensed on an optical principle.

SUMMARY OF THE INVENTION

It is therefore an object of the present invention to provide a semiconductor package which is board-mountable at both of the upper and lower surfaces thereof.

It is another object of the present invention to provide a stackable semiconductor package.

A semiconductor package having features of the present invention generally includes a semiconductor chip electrically connected to a plurality of leads arranged at the periphery of the semiconductor chip wherein each of the leads is bent to have a first portion exposed from the upper surface of the semiconductor package and a second portion exposed from the lower surface of the semiconductor package.

Since both of the first portion and the second portion can be utilized for making external electrical connection, the semiconductor package can be mounted onto a substrate, such as a printed circuit board (PC board) with the upper surface or the lower surface facing the substrate thereby providing a high degree of board mounting flexibility.

The semiconductor package of the present invention may be an image sensor package including a semiconductor sensor chip disposed on a chip-supporting member having a wall erected around the semiconductor chip. A cover is sealed over the top of the wall of the chip-supporting member. The leads mentioned above are molded integrally with the chip-supporting member.

Another benefit of having leads exposed on both of the upper and lower surfaces of the package is that it facilitates direct stacking of two or more of the packages. Therefore, the present invention also provides a variety of stack arrangements of the packages described above. The leads from adjacent packages may be soldered together or otherwise electrically connected in any suitable manner.

BRIEF DESCRIPTION OF THE DRAWINGS

These and other features, aspects, and advantages of the present invention will be more fully understood by reading the following detailed description of the preferred embodiment, with reference made to the accompanying drawings as follows.

DETAILED DESCRIPTION OF THE PREFERRED EMBODIMENT

Figure 1:
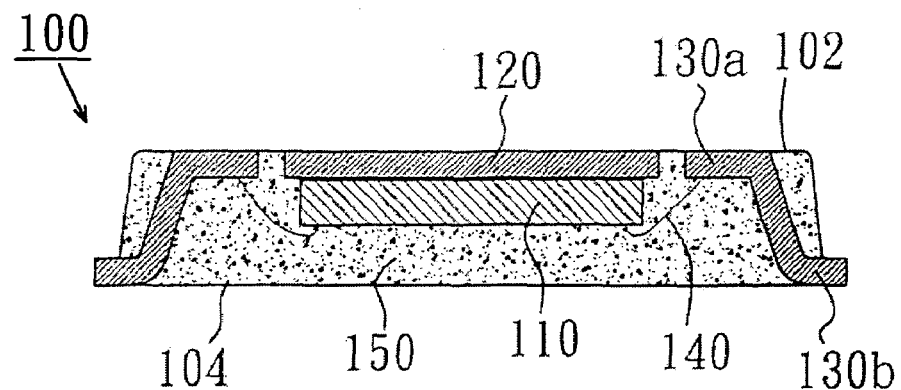
FIG. 1 is a cross sectional view of a semiconductor package according to one embodiment of the present invention.

FIG. 1 shows a semiconductor package 100 according to one embodiment of the present invention. The semiconductor package 100 mainly comprises a semiconductor chip 110 disposed on a die pad 120 and electrically connected to a plurality of leads 130 arranged at the periphery of the semiconductor chip 110. Note that each of the leads 130 is bent to have a first portion 130a exposed from the upper surface 102 of the semiconductor package 100 and a second portion 130b exposed from the lower surface 104 of the semiconductor package 100. Since both of the first portion 130a and the second portion 130b can be utilized for making external electrical connection, the semiconductor package 100 can be mounted onto a substrate, such as a printed circuit board (PC board) with the upper surface 102 or the lower surface 104 facing the substrate thereby providing a high degree of board mounting flexibility.

The semiconductor chip 110 may be mounted on the die pad 120 by a die attach material (not shown), and then, bond wires 140, for example, gold wires, are bonded by wire bonding machines to connect bonding pads on the chip 110 to the first portions 130a of the leads 130. The semiconductor chip 110 is sealed in a package body 150 by a conventional transfer-molding process. While the die pad 120 is not an essential aspect of the present invention and can be skipped, it may be helpful to have the die pad 120 which provides electromagnetic interference (EMI) shielding for the semiconductor chip 110.

Figure 2:
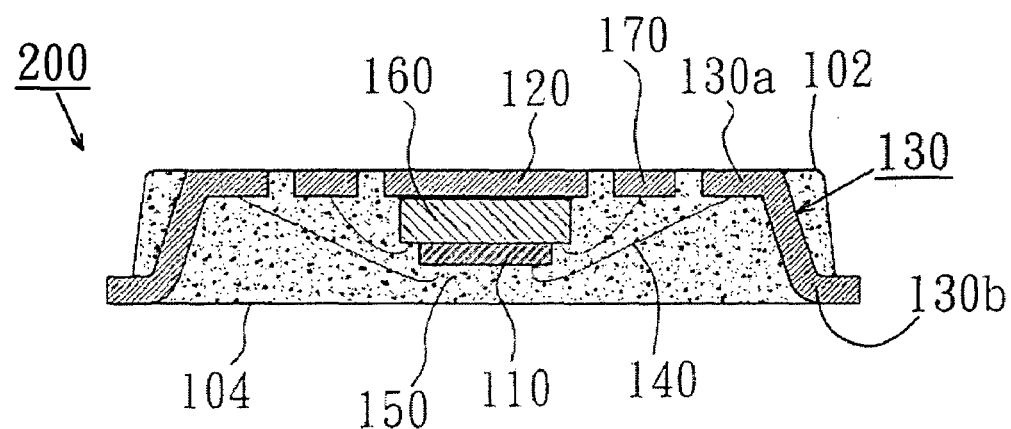
FIG. 2 is a cross sectional view of another semiconductor package according to another embodiment of the present invention.

FIG. 2 shows a semiconductor package 200 according to another embodiment of the present invention. The semiconductor package 200 is substantially identical to the semiconductor package 100 with the exception that the semiconductor package 200 further comprises another semiconductor device 160 sandwiched between the semiconductor chip 110 and the die pad 120 being disposed on the semiconductor device; and electrically connected to the lower surfaces of a plurality of contact pads 170 between the die pad 120 and the upper portions 130a of the leads 130. Note that the upper surfaces of the contact pads 170 are exposed from the upper surface 102 of the semiconductor package 200 for making external electrical connection.

One of the benefits of having leads exposed on both of the upper and lower surfaces of the package is that it facilitates mounting of active or passive components (such as chip capacitor and resistor). For example, after the leads exposed on the lower surface of the package is soldered to the corresponding contacts of an external PC board or the corresponding leads of another package, chip capacitors or chip resistors may be electrically connected to selected ones of the leads exposed on the upper surface of the package.

Figure 3:
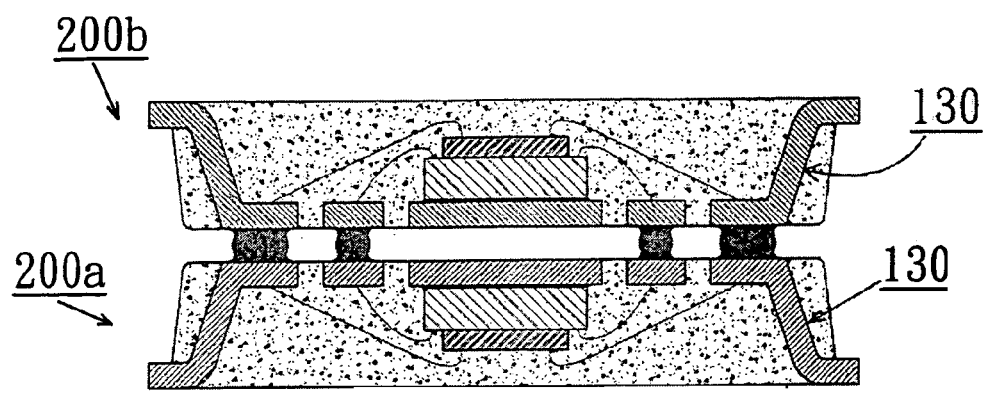
FIG. 3 is a cross sectional view of a stack of semiconductor packages according to one embodiment of the present invention.
Figure 4:
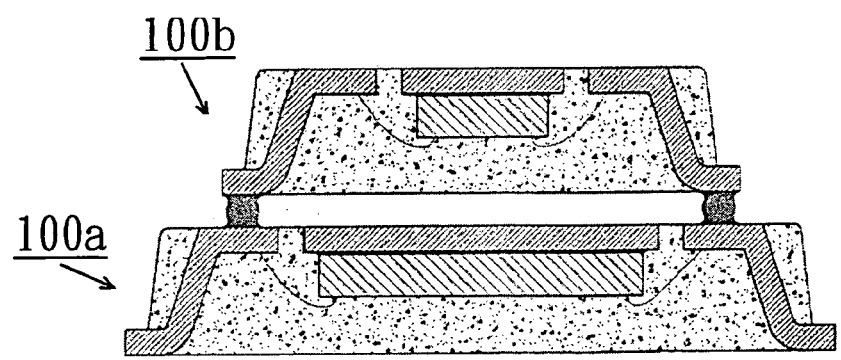
FIG. 4 is a cross sectional view of another stack of semiconductor packages according to another embodiment of the present invention.
Figure 5:
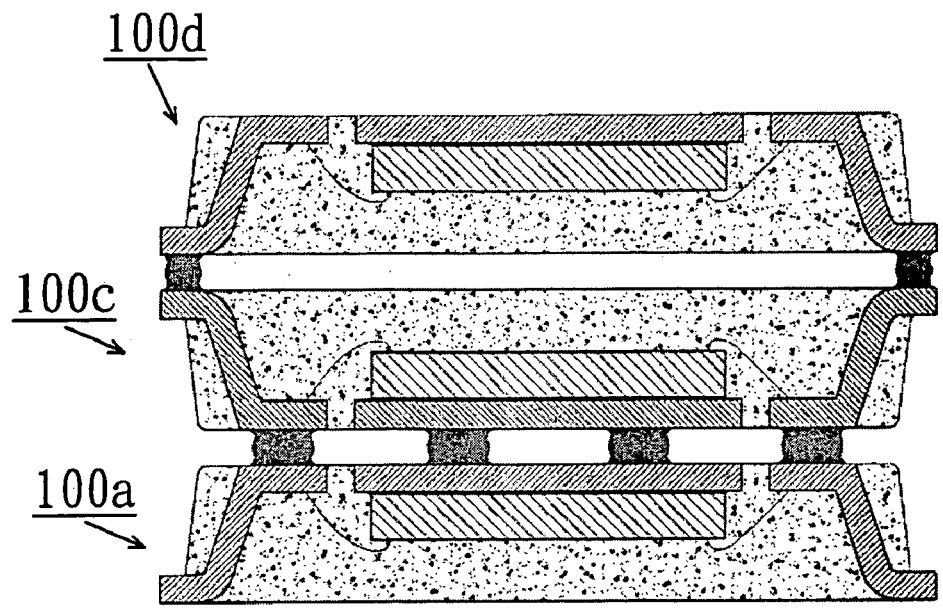
FIG. 5 is a cross sectional view of another stack of semiconductor packages according to another embodiment of the present invention.
Figure 6:
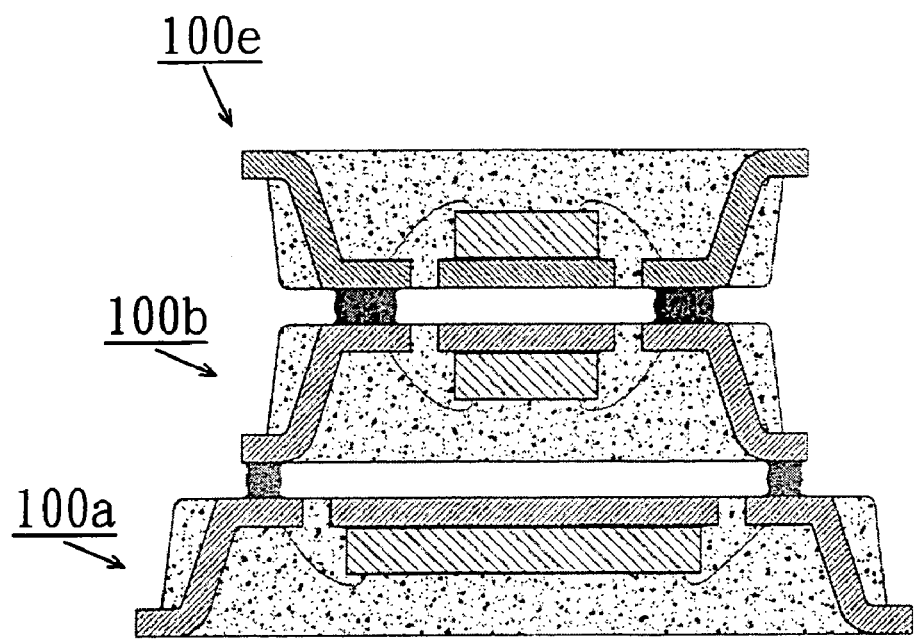
FIG. 6 is a cross sectional view of another stack of semiconductor packages according to another embodiment of the present invention.

Another benefit of having leads exposed on both of the upper and lower surfaces of the package is that it facilitates direct stacking of two or more of the packages. FIG. 3 illustrates such an arrangement wherein two packages 200a and 200b, are stacked on top of each other. In this arrangement, the package 200a is electrically coupled to the package 200b by soldering the lead 130 of the package 100a directly to a corresponding lead of the adjacent package 100b. Alternatively, the leads 130 may be electrically connected together via conductive adhesive. In the embodiment illustrated in FIG. 3, the packages 200a is mounted in a die down orientation and the packages 200b is mounted in a die up orientation. However, it should be appreciated that the orientation of the packages can be readily changed. By way of example, the packages could all be mounted in a die down orientation as illustrated in FIG. 4 (wherein two packages 100a and 100b are stacked together), in alternating die up/die down orientations as illustrated in FIG. 5 (wherein three packages 100a, 100c and 100d are stacked on top of one another) and FIG. 6 (wherein three packages 100a, 100b and 100e are stacked on top of one another) or any other permutation that is suitable for a particular purpose.

Figure 7:
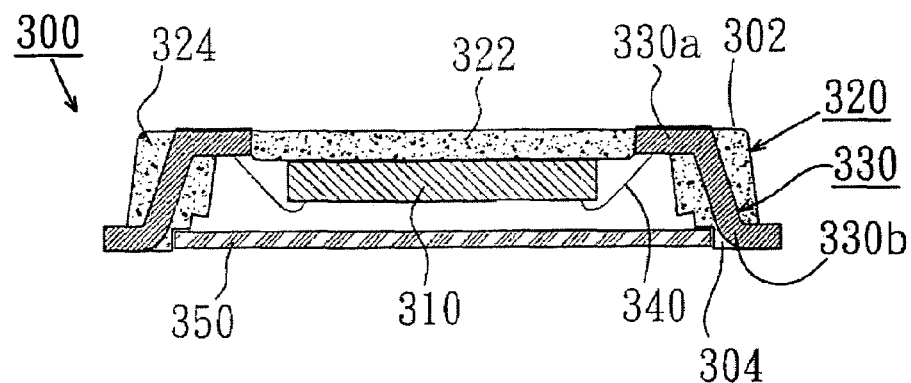
FIG. 7 is a cross sectional view of another semiconductor package according to another embodiment of the present invention.

FIG. 7 shows a semiconductor package 300 according to another embodiment of the present invention. The semiconductor package 300 mainly comprises a semiconductor chip 310 disposed on a chip-supporting member 320 and electrically connected to a plurality of leads 330 arranged at the periphery of the semiconductor chip 310. Note that each of the leads 330 is bent to have a first portion 330a exposed from the upper surface 302 of the semiconductor package 300 and a second portion 330b exposed from the lower surface 304 of the semiconductor package 300. Since both of the first portion 330a and the second portion 330b can be utilized for making external electrical connection, the semiconductor package 300 can be mounted onto a substrate, such as a printed circuit board (PC board) with the upper surface 302 or the lower surface 304 facing the substrate thereby providing a high degree of board mounting flexibility.

As shown in FIG. 7, the leads 330 of the chip-supporting member 320 are embedded in a main body 322, and the chip-supporting member 320 has a wall 324 erected from the periphery thereof with a height taller than the height of the semiconductor chip 310. Preferably, the chip-supporting member of the present invention is formed by a conventional molding process such as insert molding. This is accomplished by placing a lead frame provided with a plurality of leads in a mold having cavities and thereafter pouring thermosetting plastic material into the mold to fill the mold cavities. The mold cavities are shaped to substantially conform to the to-be-molded shape of the chip-supporting member. Finally, the molded product is placed into a curing oven, and then the plastic material is cured wherein the curing condition depends on the selected plastic material. The lead frame for use in the present invention is formed from a thin metal strip which has been etched or stamped to form the leads. Preferably, the lead frame is made of copper or alloys containing copper. Alternatively, the lead frame is made of iron, nickel or alloys thereof, and then plated with copper.

The semiconductor chip 310 may be mounted on the chip-supporting member 320 by a die attach material (not shown), and then, bond wires 340, for example, gold wires, are bonded by wire bonding machines to connect bonding pads on the chip 310 to the first portions 330a of the leads 330. A cover 350 is sealed over the top of the wall 324 of the chip-supporting member 320. Note that the semiconductor chip 310 may be an image sensing device in the form of an integrated circuit die, i.e., the image sensor chip, and the cover 350 is preferably an optically plastic lid or glass lid of high transparency thereby allowing the chip to be exposed to the object to be sensed (not shown).

Figure 8:
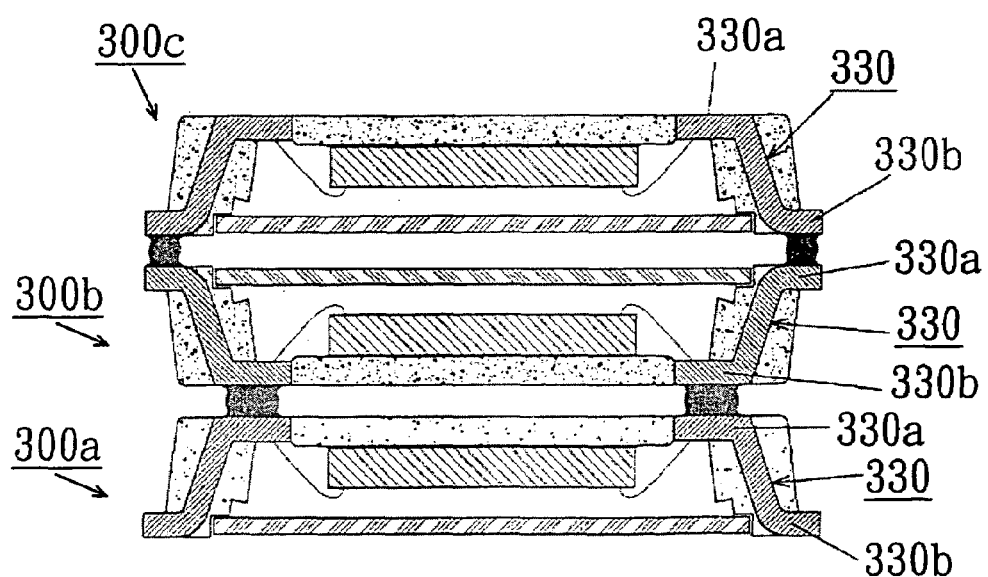
FIG. 8 is a cross sectional view of another stack of semiconductor packages according to another embodiment of the present invention.

FIG. 8 illustrates another stack arrangement wherein three packages 300a, 300b and 300c are stacked on top of each other. In this arrangement, the package 300a is electrically coupled to the package 300b by soldering the first portion 330a of the lead 330 of the package 300a directly to the second portion 330b of a corresponding lead 330 of the adjacent package 300b. The package 300b is also electrically coupled to the package 300c by soldering the first portion 330a of the lead 330 of the package 300b directly to the second portion 330b of a corresponding lead 330 of the adjacent package 300c. Alternatively, the leads 330 may be electrically connected together via conductive adhesive. In the embodiment illustrated in FIG. 8, the packages 300a, 300b and 300c are mounted in alternating die up/die down orientations.

Figure 9:
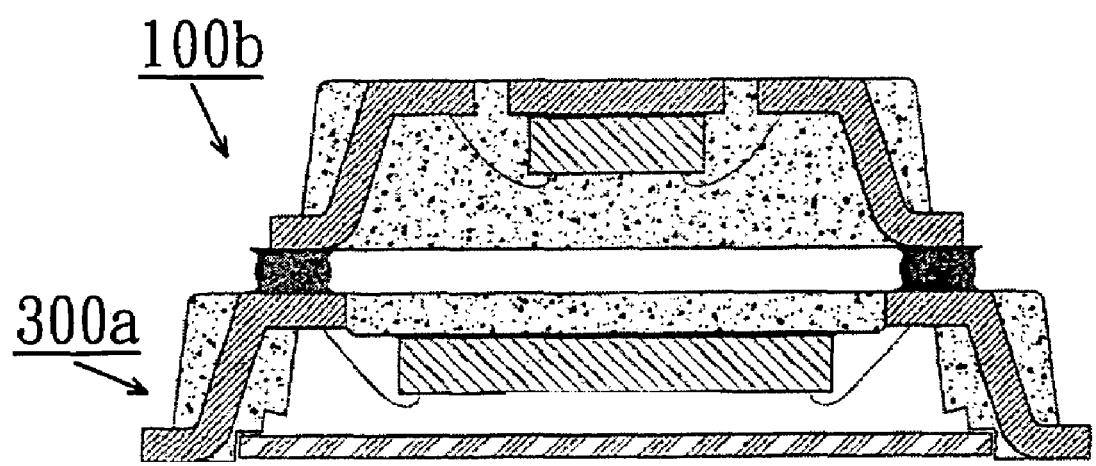
FIG. 9 is a cross sectional view of another stack of semiconductor packages according to another embodiment of the present invention.
Figure 10:
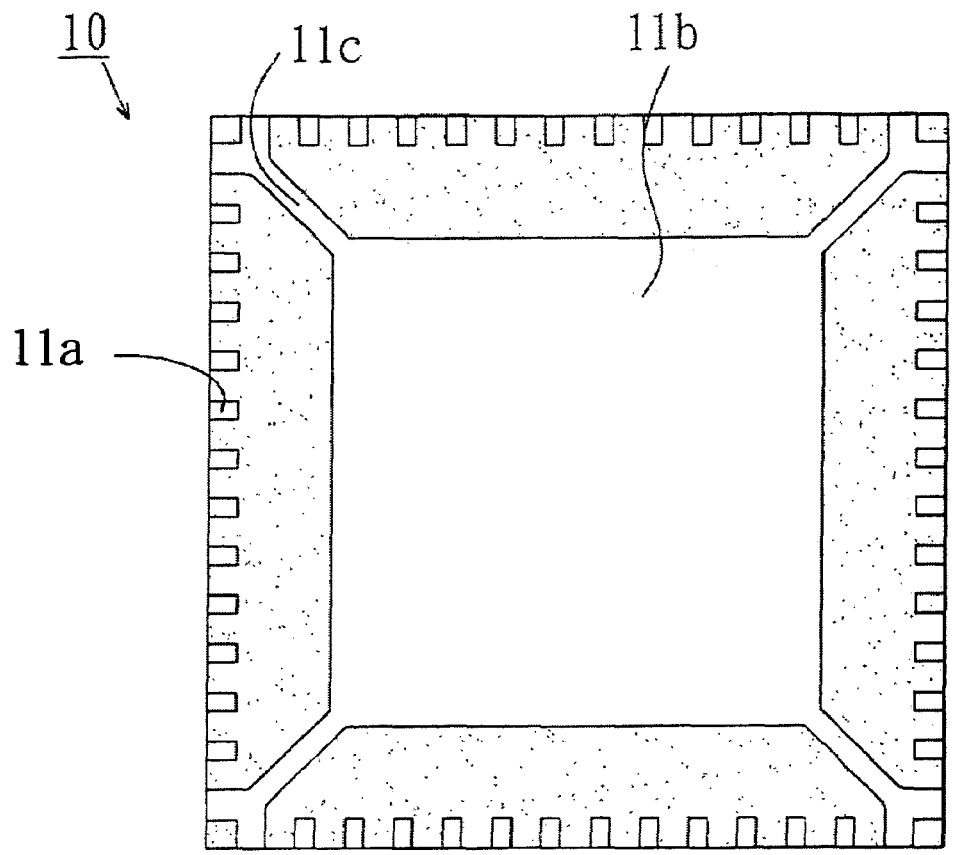
FIG. 10 is a bottom view of a conventional leadless package.
Figure 11:
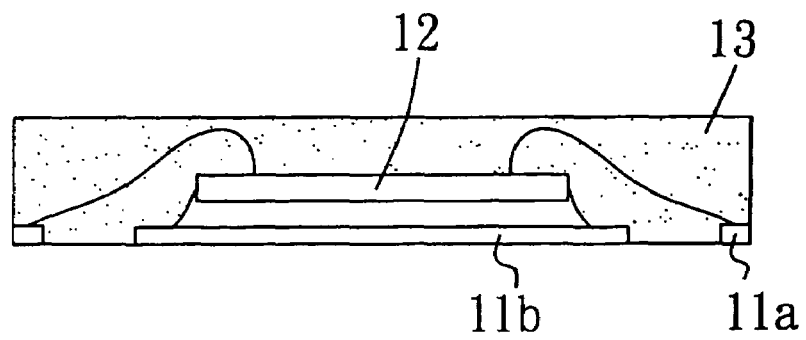
FIG. 11 is a cross-sectional view of the package of FIG. 10.

FIG. 9 illustrates still another stack arrangement wherein the package 100b is stacked on top of the package 300a.

Although the invention has been explained in relation to its preferred embodiments, it is to be understood that many other possible modifications and variations can be made without departing from the spirit and scope of the invention as hereinafter claimed.

What is claimed is:

1. A semiconductor package having opposing upper and lower surfaces comprising:
    a semiconductor chip having a plurality of bonding pads formed thereon;
    a chip-supporting member for receiving the semiconductor chip, the chip-supporting member having a wall erected around the semiconductor chip with a height taller than the height of the semiconductor chip;
    a lead frame including a plurality of leads molded integrally with the chip-supporting member, the leads being electrically connected to the bonding pads of the semiconductor chip, respectively; and
    a cover sealed over the top of the wall of the chip-supporting member, the cover having an inner surface facing the semiconductor chip and an opposing outer surface,
    wherein each of the leads has a first portion having a generally planar top surface exposed from the upper surface of the semiconductor package, a second portion having a generally planar bottom surface exposed from the lower surface of the semiconductor package for making external electrical connection, and a middle portion extending between the first and second portions wherein the middle portion of each lead is embedded inside the wall of the chip-supporting member,
    wherein the wall of the chip-supporting member has a notch for receiving the cover such that the outer surface of the cover is substantially flush with or below the top surface of the first portion of each lead.

2. The semiconductor package as claimed in claim 1, further comprising a plurality of bonding wires having one ends connected to the bonding pads of the semiconductor chip and the other ends connected to the leads.

3. The semiconductor package as claimed in claim 1, wherein the semiconductor chip is an image sensor chip and the cover is transparent.

4. A stack of semiconductor packages comprising at least two semiconductor packages mounted on top of one another to form a stack, wherein each of the semiconductor packages comprises:
    a semiconductor chip having a plurality of bonding pads formed thereon;
    a chip-supporting member for receiving the semiconductor chip, the chip-supporting member having a wall erected around the semiconductor chip with a height taller than the height of the semiconductor chip;
    a lead frame including a plurality of leads molded integrally with the chip-supporting member, the leads being electrically connected to the bonding pads of the semiconductor chip, respectively; and
    a cover sealed over the top of the wall of the chip-supporting member, the cover having an inner surface facing the semiconductor chip and an opposing outer surface,
    wherein each of the leads has a first portion having a generally planar top surface exposed from the upper surface of the semiconductor package, a second portion having a generally planar bottom surface exposed from the lower surface of the semiconductor package for making external electrical connection, and a middle portion extending between the first and second portions wherein the middle portion of each lead is embedded inside the wall of the chip-supporting member,
    wherein the wall of the chip-supporting member has a notch for receiving the cover such that the outer surface of the cover is substantially flush with or below the top surface of the first portion of each lead,
    wherein at least some of the leads from adjacent semiconductor packages in the stack are electrically connected together.

5. The stack of semiconductor packages as claimed in claim 4, wherein at least some of the leads from adjacent semiconductor packages in the stack are soldered together.

6. The stack of semiconductor packages as claimed in claim 4, wherein at least some of the leads from adjacent semiconductor packages in the stack are electrically connected together via conductive adhesive.

7. A stack of semiconductor packages comprising a first semiconductor package and a second semiconductor package mounted on top of each other to form a stack, wherein:
    the first semiconductor package comprises:
    a semiconductor chip having a plurality of bonding pads formed thereon;
    a lead frame including a plurality of leads arranged at the periphery of the semiconductor chip, the leads being electrically connected to the bonding pads of the semiconductor chip, respectively; and
    a package body formed over the semiconductor chip and the leads; and
    the second semiconductor package comprises:
    a semiconductor chip having a plurality of bonding pads formed thereon;
    a chip-supporting member for receiving the semiconductor chip, the chip-supporting member having a wall erected around the semiconductor chip with a height taller than the height of the semiconductor chip;
    a lead frame including a plurality of leads molded integrally with the chip-supporting member, the leads being electrically connected to the bonding pads of the semiconductor chip, respectively; and
    a cover sealed over the top of the wall of the chip-supporting member,
    wherein each of the leads has a first portion having a generally planar top surface exposed from the upper surface of the semiconductor package, a second portion having a generally planar bottom surface exposed from the lower surface of the semiconductor package for making external electrical connection, and a middle portion extending between the first and second portions wherein the middle portion of each lead is embedded inside the wall of the chip-supporting member, the wall of the chip-supporting member has a notch for receiving the cover such that the outer surface of the cover is substantially flush with or below the top surface of the first portion of each lead, and the second portions of some of the leads from the first semiconductor package are electrically connected to the first portions of some of the leads from the second semiconductor package.

8. The stack of semiconductor packages as claimed in claim 7, wherein the second portions of some of the leads from the first semiconductor package and the first portions of some of the leads from the second semiconductor package are soldered together.

9. The stack of semiconductor packages as claimed in claim 7, wherein the second portions of some of the leads from the first semiconductor package are electrically connected to the first portions of some of the leads from the second semiconductor package via conductive adhesive.

* * * * *